(12) United States Patent
Vera Villarroel et al.

(10) Patent No.: US 10,498,461 B1
(45) Date of Patent: Dec. 3, 2019

(54) OPTICAL RECEIVERS WITH DC CANCELLATION BIAS CIRCUIT AND EMBEDDED OFFSET CANCELLATION

(71) Applicant: Elenion Technologies, LLC, New York, NY (US)

(72) Inventors: Ariel Leonardo Vera Villarroel, Union City, NJ (US); Abdelrahman Ahmed, Brooklyn, NY (US); Alexander Rylyakov, Staten Island, NY (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 16/135,914

(22) Filed: Sep. 19, 2018

(51) Int. Cl.
| | |
|---|---|
| *H04B 10/06* | (2006.01) |
| *H04B 10/61* | (2013.01) |
| *H03F 3/08* | (2006.01) |
| *H03F 3/45* | (2006.01) |
| *H03G 3/30* | (2006.01) |
| *H04B 10/69* | (2013.01) |
| *H04B 1/30* | (2006.01) |

(52) U.S. Cl.
CPC ............. *H04B 10/616* (2013.01); *H03F 3/08* (2013.01); *H03F 3/456* (2013.01); *H03F 3/45941* (2013.01); *H03G 3/3084* (2013.01); *H04B 10/6931* (2013.01); *H04B 2001/305* (2013.01)

(58) Field of Classification Search
CPC .............. H04B 10/616; H04B 10/6931; H04B 2001/305; H03F 3/08; H03F 3/456; H03F 3/45941; H03G 3/3084
USPC ........ 398/202, 203, 204, 206, 207, 208, 209
See application file for complete search history.

(56) References Cited

U.S. PATENT DOCUMENTS

| | | | | |
|---|---|---|---|---|
| 6,456,141 | B1* | 9/2002 | Nishizono | ............... H03F 3/087 250/214 A |
| 7,532,065 | B2* | 5/2009 | Chen | ................... H03F 3/45973 330/9 |
| 8,970,300 | B2* | 3/2015 | Piepenstock | ........... H03G 1/007 330/254 |
| 9,425,743 | B2* | 8/2016 | Kim | ...................... H03F 1/0205 |
| 9,543,906 | B2* | 1/2017 | Tanaka | ...................... H03F 3/08 |
| 9,780,737 | B1* | 10/2017 | Asmanis | ................... H03F 3/08 |
| 2010/0254711 | A1* | 10/2010 | Miller | ..................... H03F 3/087 398/136 |
| 2019/0020320 | A1* | 1/2019 | Nallani | ............... H03F 3/45179 |

* cited by examiner

*Primary Examiner* — Mohammad R Sedighian
(74) *Attorney, Agent, or Firm* — Stratford Managers Corporation (57) ABSTRACT

In optical receivers, cancelling the DC component of the incoming current is a key to increasing the receiver's effectiveness, and therefore increase the channel capacity. Ideally, the receiver includes a DC cancellation circuit for removing the DC component; however, in differential receivers an offset may be created between the output voltage components caused by the various amplifiers. Accordingly, an offset cancellation circuit is required to determine the offset and to modify the DC cancellation circuit accordingly.

12 Claims, 12 Drawing Sheets

Figure 12b

OPTICAL RECEIVERS WITH DC CANCELLATION BIAS CIRCUIT AND EMBEDDED OFFSET CANCELLATION

TECHNICAL FIELD

The present invention relates to an optical receiver, and in particular to an optical receiver with a DC cancellation bias circuit with embedded offset cancellation.

BACKGROUND

Information is transmitted in an optical channel using optical modulation. In a receiver, the received optical signal contains the information, which could have been modulated in amplitude, phase, polarization or a combination thereof. The demodulation of the optical signal is done using a transducer, e.g. photodiode, that converts from the optical to the electrical domain. The transducer delivers an electrical signal, which is processed to extract the information contained in the optical signal. The maximum to minimum optical power, i.e. dynamic range, together with the transducer define the received electrical signal dynamic range. Modern communication systems use complex modulation schemes, e.g. quadrature modulation, to increase the communication channel efficiency. The efficiency of complex modulation schemes is proportional to the maximum operation frequency, i.e. baud rate, and dynamic range.

The received optical signal is transformed to an electrical signal using a transducer. Most transducers convert optical signals to electrical current. However, the current magnitude, which is proportional to the received optical power, needs to be amplified. Typically, during amplification the electrical current is converted to a voltage. The current-to-voltage amplifier, or transimpedance amplifier, together with the bias circuits for proper operation remains one of the most challenging components in an optical receiver.

Incoming optical signal transformed to the electrical domain contain a variable component, i.e. the information, and a fix component, i.e. direct current (DC). The DC component must be minimized so that its effect is negligible in the receiver. Typically a sink circuit, i.e. a DC cancellation circuit, is used at the TIA input. If the receiver architecture uses differential circuit topologies for better performance, then the receiver will be sensitive to unbalanced DC inputs, i.e. input offset. Moreover, offset within the receiver will also be generated due to asymmetry existing in the receiver. In a balanced receiver, each of the differential inputs may have a transducer, therefore, the sink circuit must be able to remove the constant component while minimizing the difference between the fixed components, i.e. offset between the input signals Receiver circuits are designed to provide large gain, e.g. more than 70 dB of transimpedance gain. Therefore, any offset introduced at the input is amplified accordingly, resulting in the partial or complete loss of information. Offset may also be generated within the receiver as a consequence of a mismatch and a process variation during chip fabrication, and similar to the offset introduced by the transducer, the information can be partially or completely lost if there is no offset correction. A DC cancellation circuit and an offset cancellation circuit may be used, whereby each of these components independently sense a reference and inject a corrective signal. Furthermore, conventional sensing and correction are typically done in the high frequency (HF) path, consequently, the HF performance may be affected in bandwidth, noise, linearity or a combination thereof.

An object of the present invention is to overcome the shortcomings of the prior art by providing a receiver including a DC cancellation circuit that minimizes the effect of DC components in the incoming electrical signals, and an embedded offset cancellation circuit for minimizing the effect of the offset introduced by receivers with differential topologies.

SUMMARY OF THE INVENTION

Accordingly, the present invention relates to an optical receiver comprising:

at least one photodetector capable of generating a differential input current including first and second input current components in response to an optical signal;

a trans-impedance amplifier (TIA) capable of converting the first and second input current components into first and second input voltage components;

a variable gain amplifier (VGA) capable of amplifying the first and second input voltage components to a desired output voltage forming first and second output voltage components;

a DC cancellation circuit (DCCC) for cancelling a DC portion of the first and second input current components or the first and second input voltage components by comparing the first and second input current components or the first and second input voltage components to respective first and second reference voltages or currents, and sinking the DC portion of the first and second input current components based on the comparison; and an offset cancellation circuit (OCC) capable of obtaining voltage samples after the TIA for cancelling any offset between the first and second output voltage components by modifying at least one of the first or second reference voltages.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
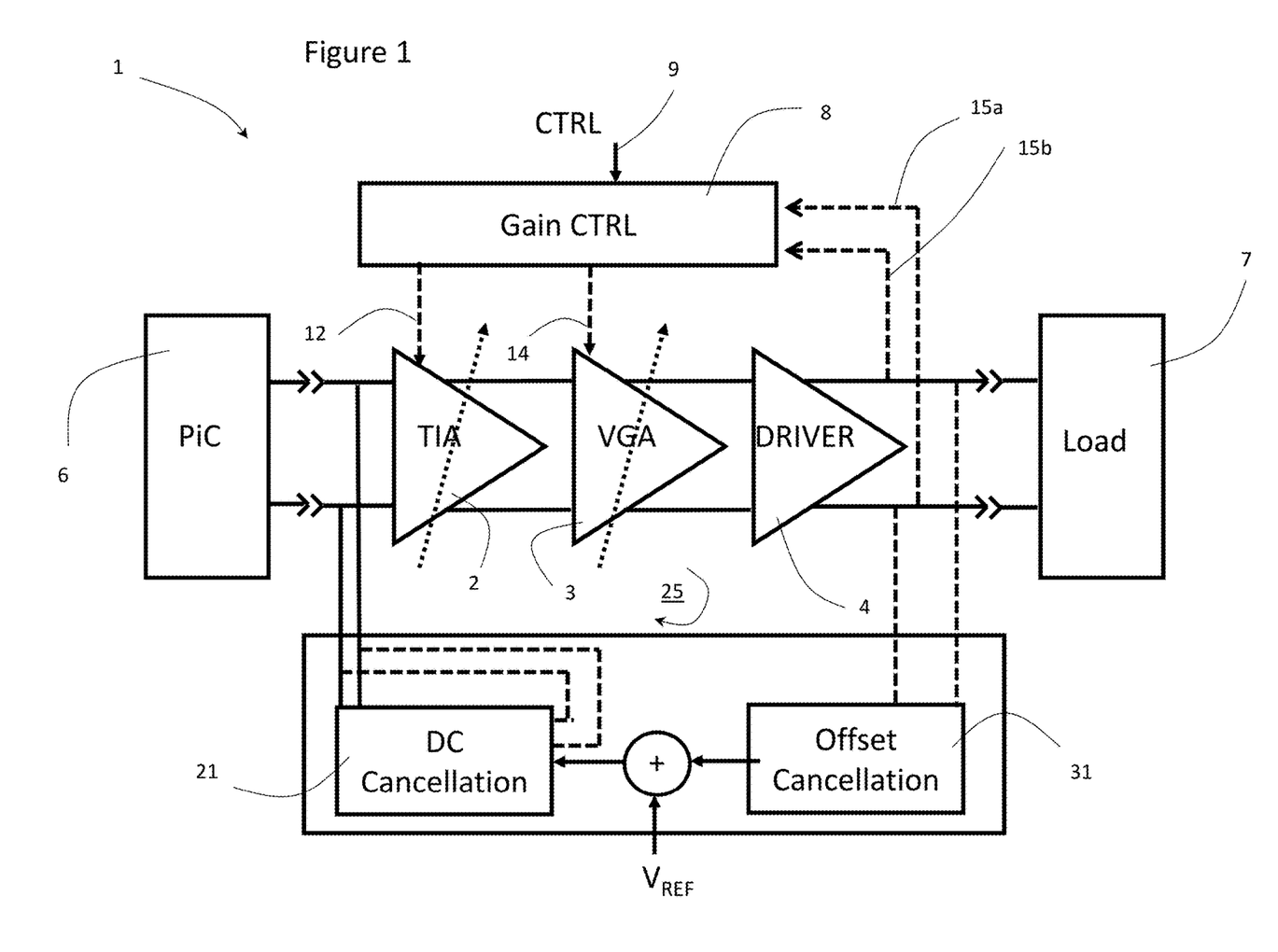
FIG. 1 is a schematic diagram of an optical receiver in accordance with an embodiment of the present invention.

With reference to FIG. 1, a receiver 1 includes a variable gain trans-impedance amplifier (TIA) 2 for converting a photodiode current signal into a voltage signal, a variable gain amplifier (VGA) 3 for amplifying the voltage signal, and a driver stage 4 for driving subsequent stages, e.g. an ADC. The front end of the receiver 1 may be connected to a general transducer, which may be contained in a photonic integrated circuit (PIC) 6 including one or more transducers, such as one or more photodetectors, and preferably a pair of photodiodes. The back end of the receiver 1 may be connected to an output load, e.g. a digital signal processor 7 for converting the output of the receiver 1 into digital signals.

The receiver 1 includes a Gain Control Circuit (GCC) 8 to set the gain of the TIA 2 and the VGA 3, via TIA and VGA gain control signals 12 and 14, respectively, for a given range of input signal power and desired range of output signal power. The gain control circuit 8 is typically implemented as an open loop control or a close loop control. An open loop implementation sets the gain of the TIA 2 and the VGA 3 according to an overall gain control signal 9 from a device controller (not shown). A closed loop control senses the output signal power from the TIA 2, the VGA 3 or the driver stage 4, via feedback signals 15a and 15b to a power, e.g. voltage, detector in the gain control circuit 8, and varies the gain of the TIA 2 and the VGA 3 to set the desired output voltage magnitude. The closed loop mode is also known as automatic gain control (AGC).

Figure 2A:
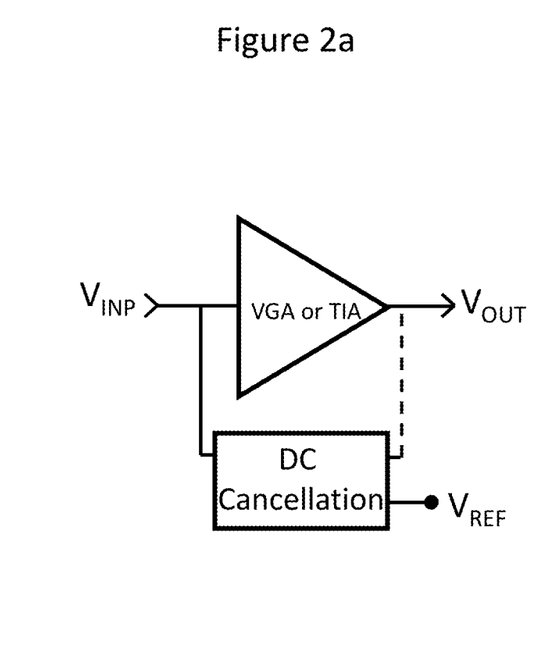
FIG. 2a is a schematic diagram of a trans-impedance amplifier (TIA) of the optical receiver of FIG. 1 with a DC cancellation circuit defining the output bias condition.
Figure 2B:
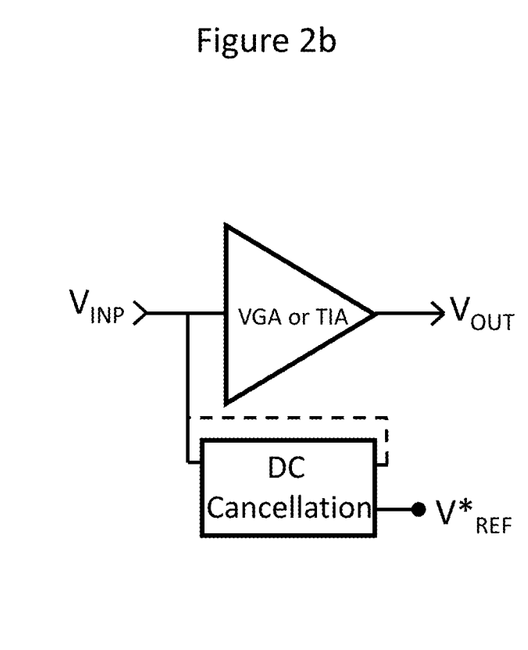
FIG. 2b is a schematic diagram of a trans-impedance amplifier (TIA) of the optical receiver of FIG. 1 with a DC cancellation circuit defining the input bias condition.

A DC cancellation circuit 21 is provided to maintain the receiver input bias while suppressing any DC component at the input generated by a optical-to-electrical transducer, e.g. a photodiode. The DC cancellation circuit 21 uses a closed loop 25 in which a sample voltage or current is compared to a reference voltage (or current) VREF. VREF may be the optimum input bias for the TIA 2, and therefore depends on the TIA circuit topology. Ideally, the VREF provides the best noise, bandwidth, linearity etc. according to the design specifications. Typically, VREF may be 0.3V to 1.5V, and ideally about 1V, but other TIA designs may utilize a VREF above or below these values. VREF is an on-chip (or off-chip) reference voltage that may be designed to be invariant, e.g. bandgap voltage, or have a temperature or process dependency. The closed loop 25 is used to define the output (FIG. 2a) or the input (FIG. 2b) bias condition. The reference voltage (or current) VREF is selected to guarantee proper operation of the receiver 1.

Figure 3:
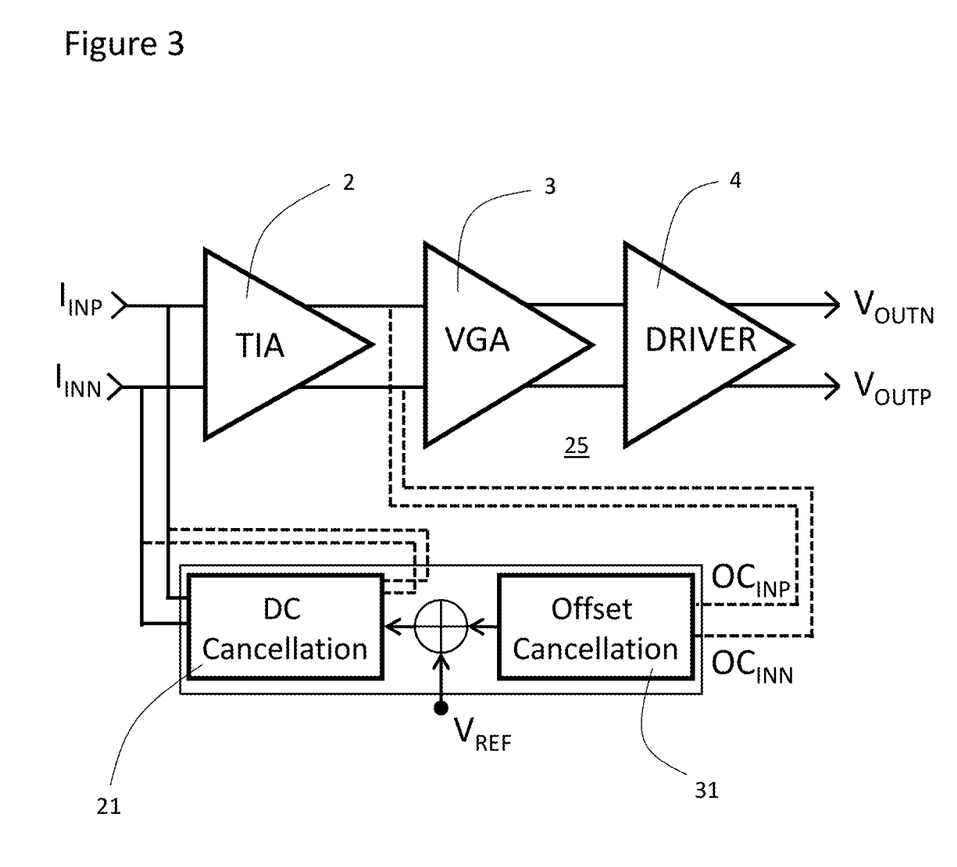
FIG. 3 is a schematic diagram of a differential input and differential output trans-impedance amplifier (TIA) of the optical receiver of FIG. 1 with a DC cancellation circuit and a offset cancellation circuit.

With reference to FIG. 3, an embedded offset cancellation circuit 31 is used to modify, e.g. increase or decrease the magnitude, the reference voltage or current used by the DC cancellation circuit 21. Offset introduced by the transducer, in PIC 6, and offset generated in the receiver 1 are minimized overall with a small increase in area and power consumption. In general, an amplifier, e.g. TIA 2 or VGA 3, uses the DC cancellation circuit 21 to suppress DC components, either voltage or current. The closed loop 25 ensures that the sample point (either input or output) matches the reference voltage or current VREF used to define the closed loop condition.

Careful design and manufacture may be done to ensure the information is not suppressed within the closed loop 25, which is typically achieved by selecting the closed loop maximum operating frequency well below the low cut-off frequency of the incoming signal.

The example illustrated in FIG. 3 provides differential input currents IINP and IINN with amplification and conversion to differential output voltages VOUTP and VOUTN via the TIA 2, the VGA 3 and the driver 4. The DC cancellation circuit 21 defines the TIA input bias according to the reference voltage VREF. The embedded offset cancellation circuit 31 may use the same sensing points or separate sensing points (OCINP OCINN) just after the TIA 2 or just after the VGA 3 to sample the TIA output voltages VOUTP and VOUTN. The offset cancellation circuit 31 modifies the reference voltages (or currents) VREF1 and VREF2 used in the DC cancellation circuit 21. Extensive verification, e.g. verification of loop maximum frequency below signal minimum frequency, loop stability, nested loop stability, is required to ensure the variation in the reference voltages or currents VREF1 and VREF2 of the DC cancellation circuit 21 needed to compensate offset at the TIA output does not degrade the performance of the TIA 2.

Figure 4:
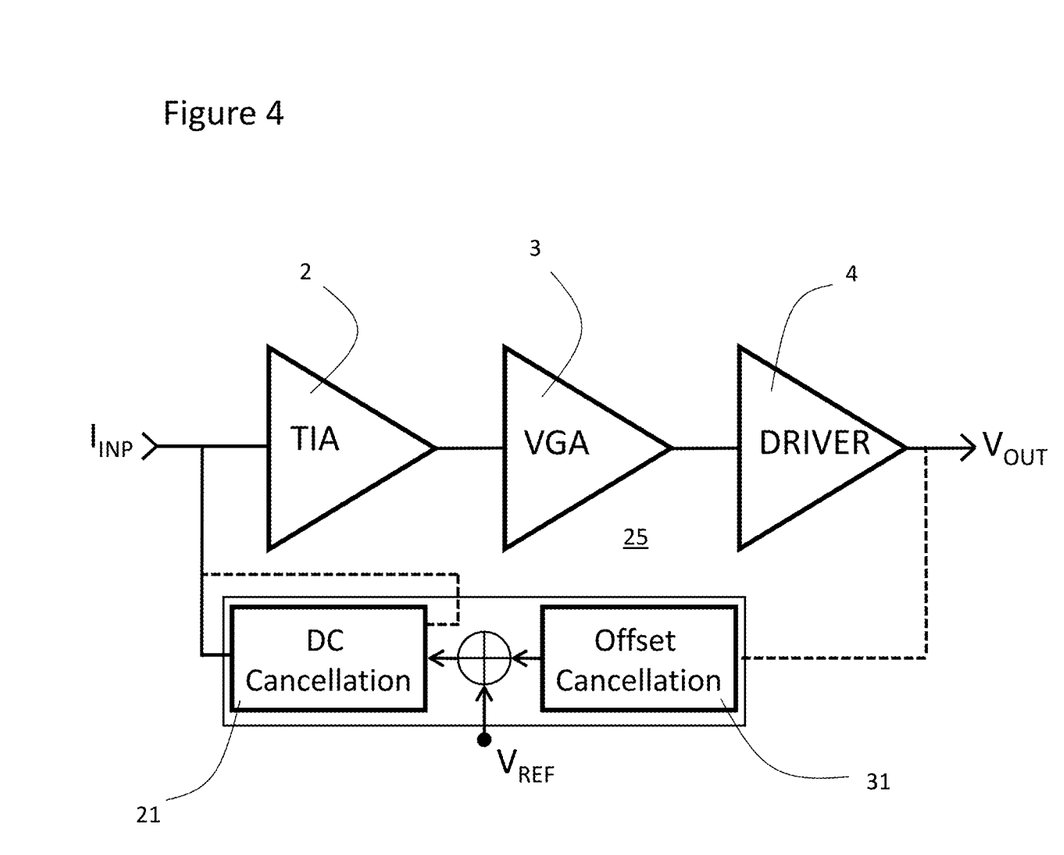
FIG. 4 is a schematic diagram of an embodiment of a receiver with a DC cancellation circuit and a offset cancellation circuit with a different sampling location.
Figure 5:
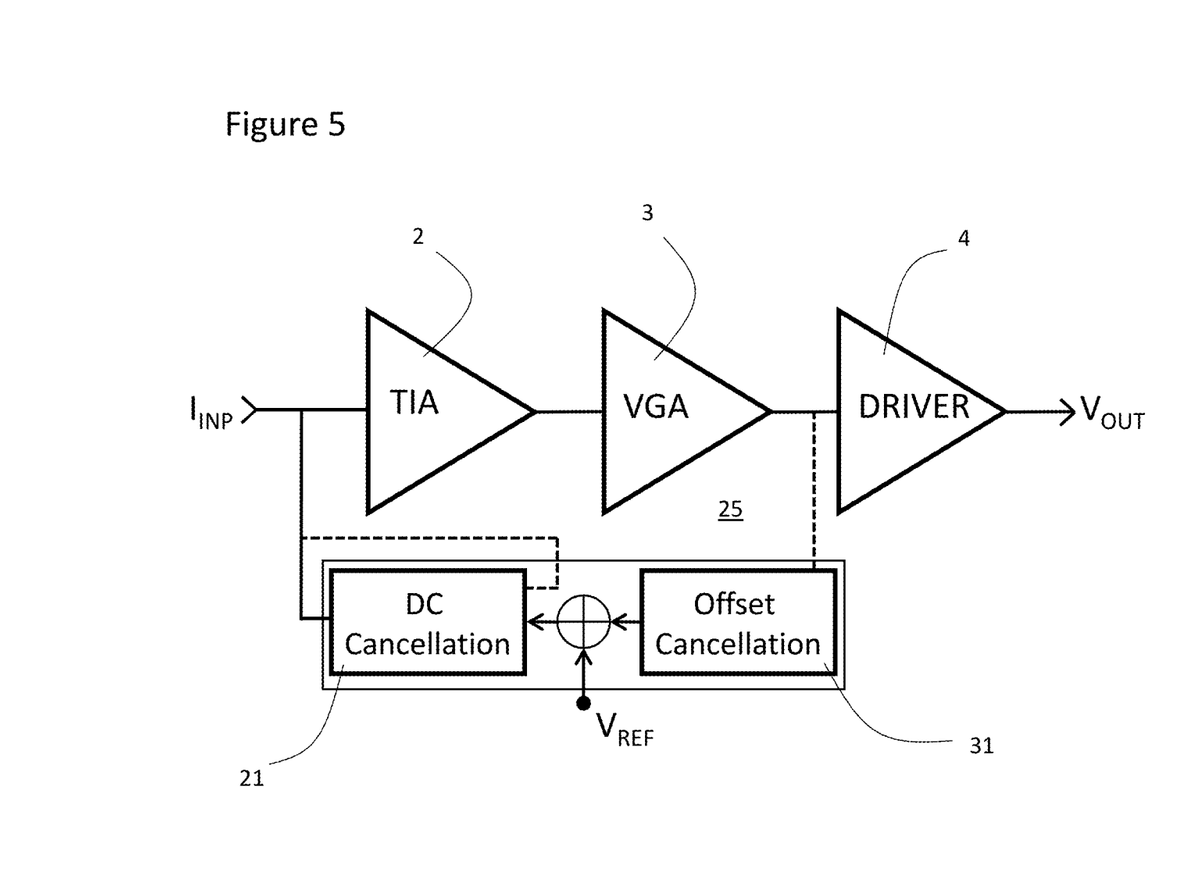
FIG. 5 is a schematic diagram of an embodiment of a receiver with a DC cancellation circuit and a offset cancellation circuit with yet another sampling location.

Flexibility in the location of the offset cancellation sensing points OCINP OCINN enables the correction of offset within the receiver path. For example, the sensing points OCINP OCINN may be located after the TIA 2, between the TIA 2 and the VGA 3, as in FIG. 3, after the driver 4, as in FIG. 4 or after the VGA 3, between the VGA 3 and the driver 4, as in FIG. 5.

The DC cancellation sensing point is shown at the input prior to the TIA 2; however, other sensing points may also be used, e.g. in between the TIA 2 and the VGA 3.

The interaction between the DC cancellation 21 and the offset cancellation 31 must be verified to avoid any penalty in the receiver performance Depending on the sensing point, the offset cancellation circuit 31 and the reference voltage or current VREF may be combined with different signs and weights.

Figure 6:
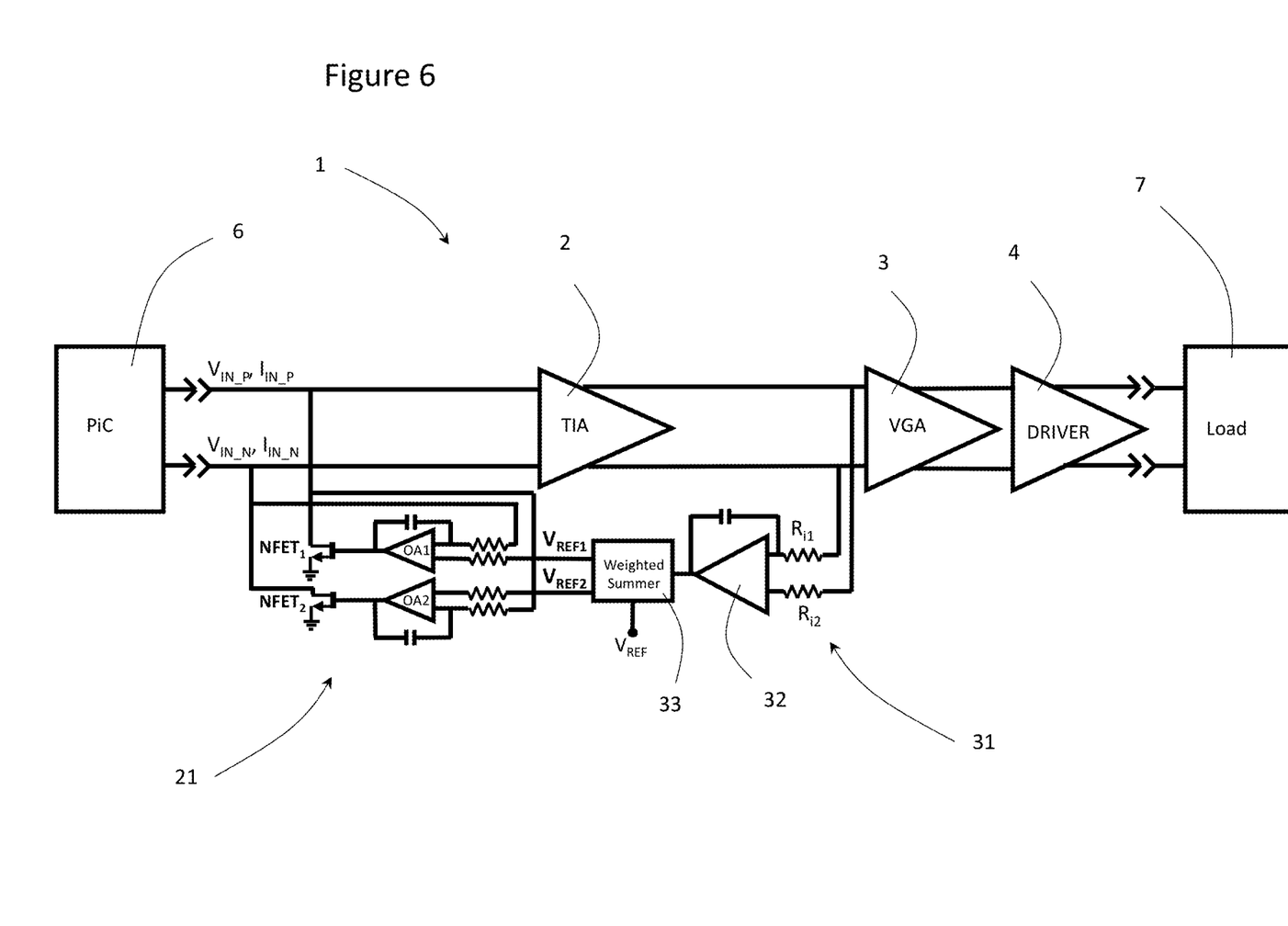
FIG. 6 is a schematic diagram a receiver utilizing the TIA of FIG. 3.

With reference to FIG. 6, the receiver 1 includes an implementation of the DC cancellation circuit 21 with the embedded offset cancellation circuit 31. The DC cancellation circuit 21 suppress DC components in the receiver input. Offset at the output of the TIA 2 is suppressed by sensing the voltage after the TIA 2, and modifying the DC cancellation reference voltage VREF accordingly.

The offset cancellation circuit 31 includes a voltage comparator 32 with a first input resistor Ri1 for sensing the first voltage component, and a second input resistor Ri2 for sensing the second voltage component. The voltage output of the voltage comparator 32, i.e. the difference or offset between the two voltage components, is fed to a weighted summer 33 for combining with the reference voltage (or current) VREF. The weighted summer 33 adds or subtracts the output from the comparator, i.e. the offset cancellation circuit 31, to one of two reference voltage VREF1 and VREF2 signals provided to the DC cancellation circuit 21. Alternatively, a first portion, e.g. ½, of the offset is added to one reference voltage VREF1 and a second portion, e.g. ½, of the offset is subtracted from the other reference voltage VREF2.

In the DC cancellation circuit 21, each reference voltage signal VREF1 and VREF2 is compared in voltage comparators OA1 and OA2 with one of the sensing input points taken at the input of the TIA 2. The difference between the sensed point and the modified reference voltage signals VREF1 and VREF2 is used to control a first terminal, e.g. gate, of first and second feedback transistors, e.g. NFET1 and NFET2, to sink the input DC current of the input current signals IIN_P and IIN_N via the second and third terminals, e.g. drain and source, of the first and second feedback transistors NFET1 and NFET2, and set the DC input voltage VIN_P and VIN_N.

Figure 7:
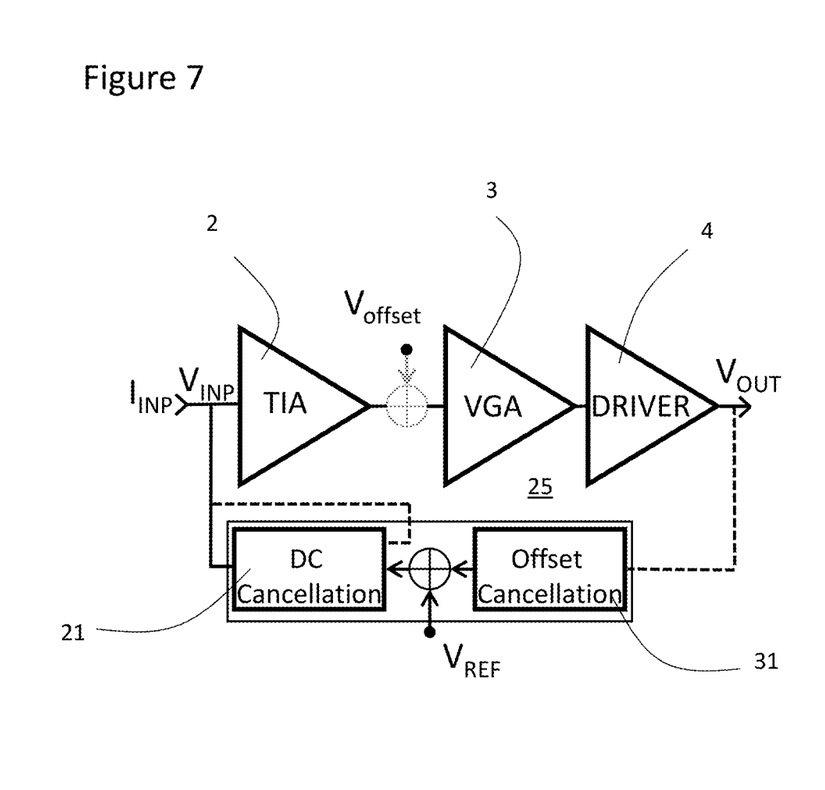
FIG. 7 is a schematic diagram of the receiver of FIG. 4 with a predetermined offset.
Figure 8A:
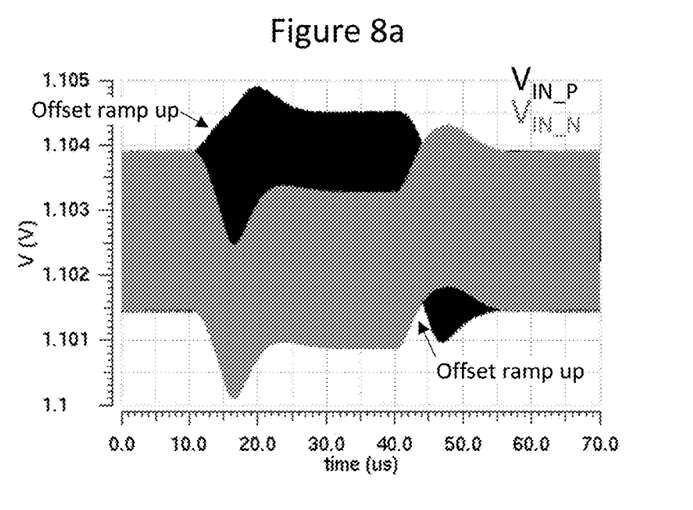
FIG. 8a is a plot of the VGA input voltage vs time with an introduced offset, as shown in the receiver of FIG. 7.
Figure 8B:
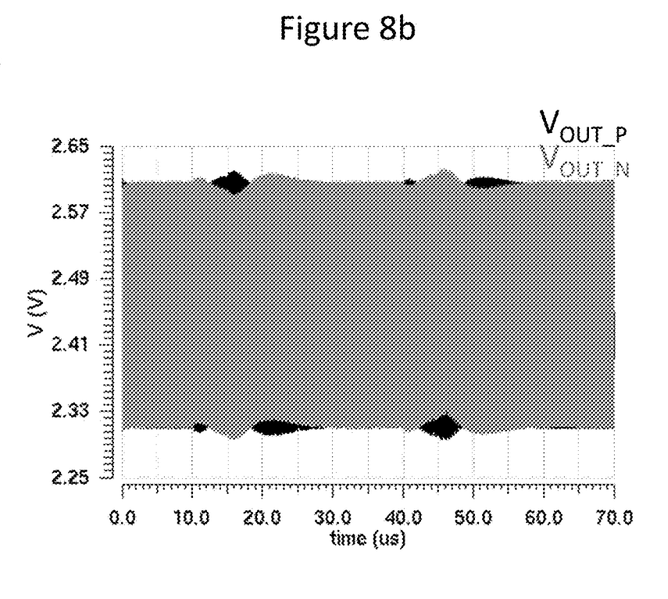
FIG. 8b is a plot of the receiver output voltage (V) vs time (μs) for the receiver of FIG. 7.

As an example, illustrated in FIG. 7, a predetermined offset Voffset is added in the high frequency path of the receiver 1. The added offset Voffset is corrected by the offset cancellation loop, which senses the receiver output voltage and modifies the TIA input voltage (FIG. 8a) such the output voltage does not have offset (FIG. 8b)

Figure 9:
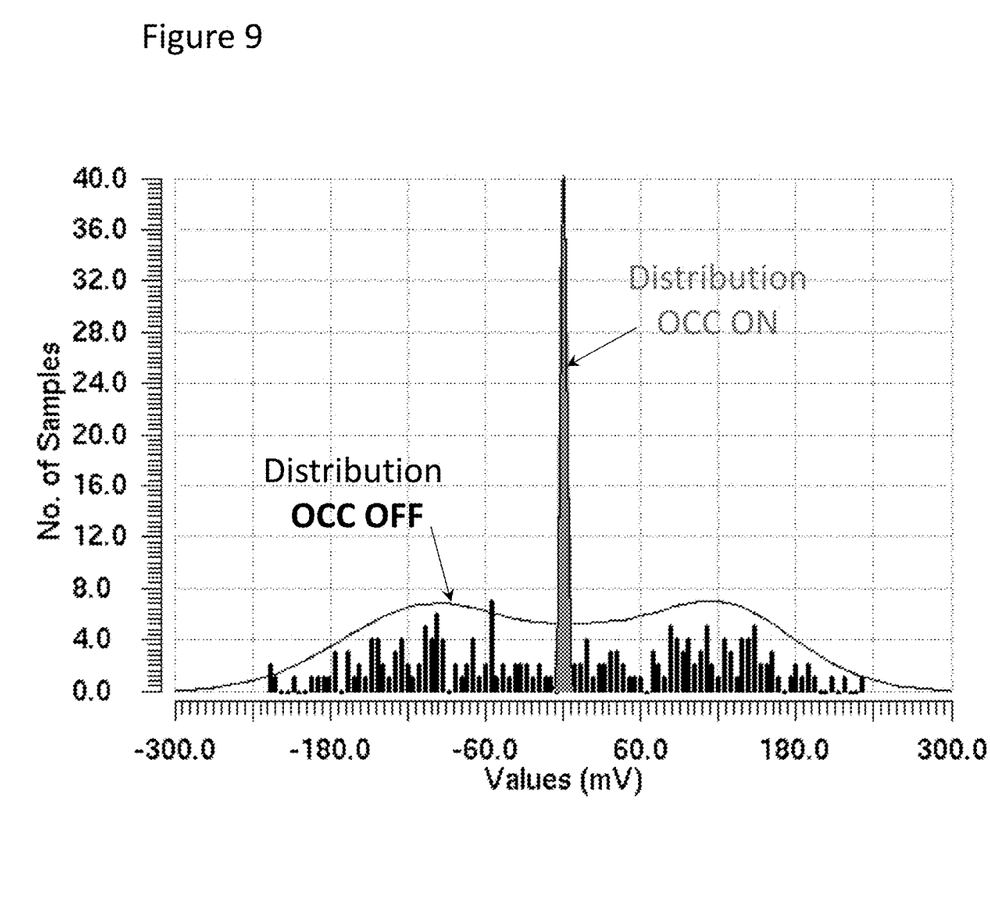
FIG. 9 is a plot of Output Voltage offset (mV) from a Monte Carlo simulation with the offset cancellation circuit (OCC) ON and OFF.

Large gain (typically more than 70 dB) is required from the receiver 1, therefore, any asymmetry within the receiver 1 will generate an offset signal that can potentially degrade the output signal. Offset generated within a receiver path can take values comparable to the output voltage. Under that condition the information can be lost. FIG. 9 illustrates a Monte Carlo (MC) simulation with superimposed results when the offset cancellation circuit (OCC) 31 is OFF and ON. When the offset cancellation circuit is turned OFF, the offset measured at the receiver output is about +/−240 mV. This value will affect the output voltage in the receiver 1, and therefore the incoming signal can be partially or completely lost. The offset compensation loop turned ON reduces the offset content to less than +/−20 mV, i.e., more than one order of magnitude, as shown in the MC run with the offset cancellation circuit (OCC) ON (FIG. 9)

Figure 10:
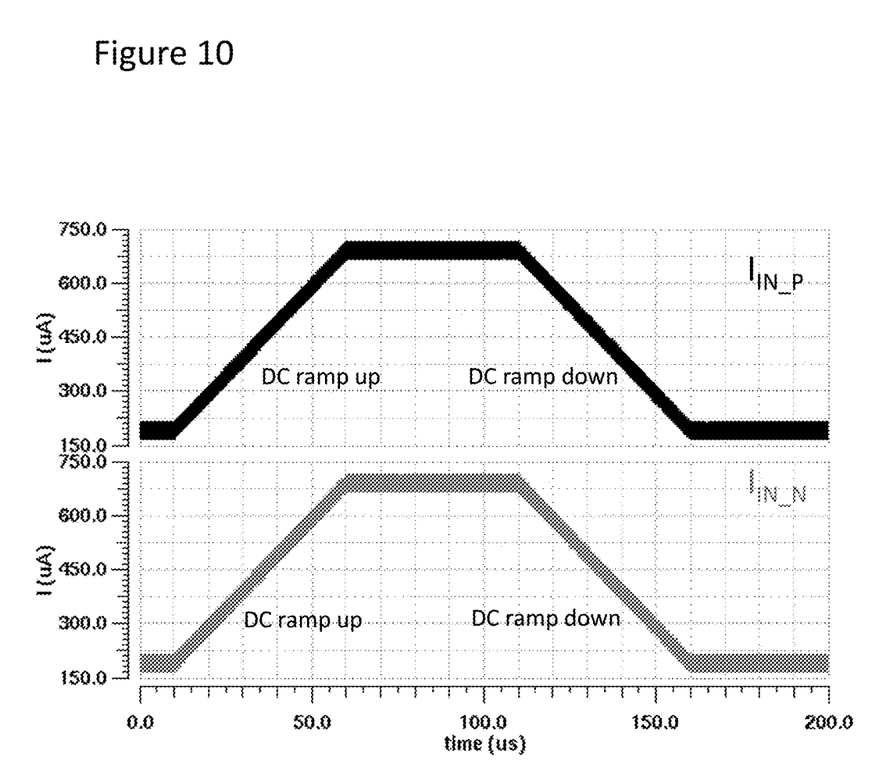
FIG. 10 is a plot of current (µA) vs. time (µs) for two differential current components.
Figure 11:
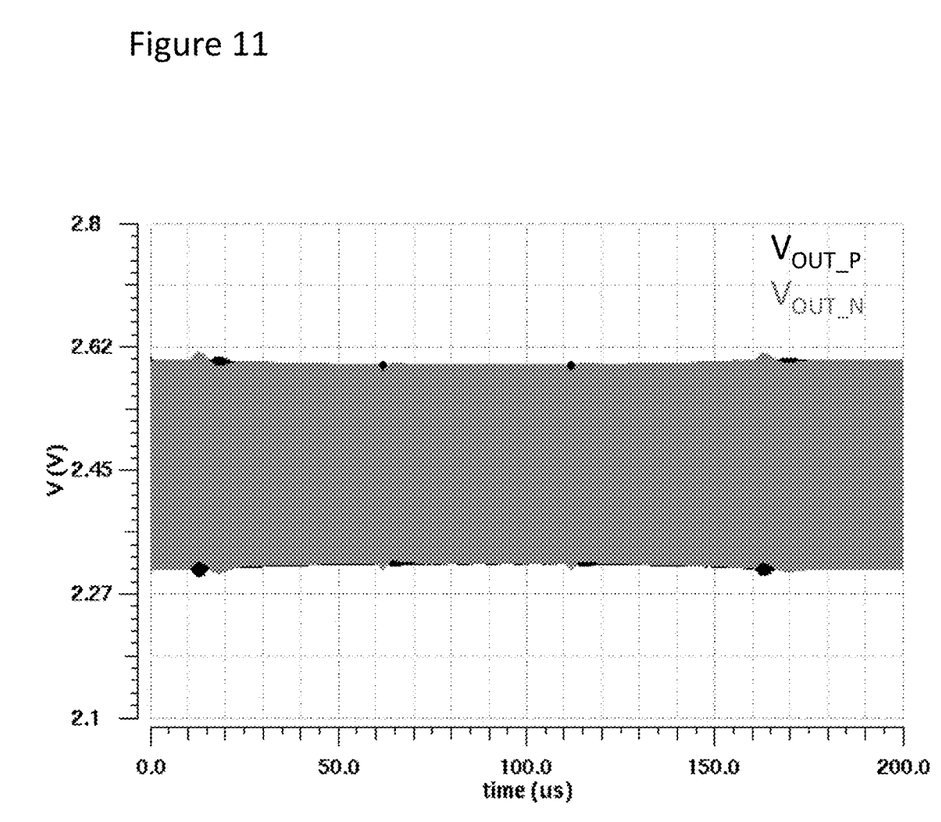
FIG. 11 is a plot of output voltage (V) vs. time (µs) for two differential output voltage components.

With reference to FIG. 10, the DC cancellation circuit 21 sets the voltage at the inputs of the TIA 2 for proper operation. The input currents IIN_P and IIN_N contain a variable and a constant component, i.e. IIN_P=+Iin+Idc and IIN_N=−Iin+Idc The variation of the single ended output terminals is shown in FIG. 10. In the example, IIN_P and IIN_N have a high frequency component and a DC component that is changing over time. The DC cancellation circuit 21 removes the DC component using a current sinker and a control loop that maintains stable the TIA input common-mode voltage. Therefore, the variation in DC component does not affect the output voltage, as shown in FIG. 11.

Figure 12A:
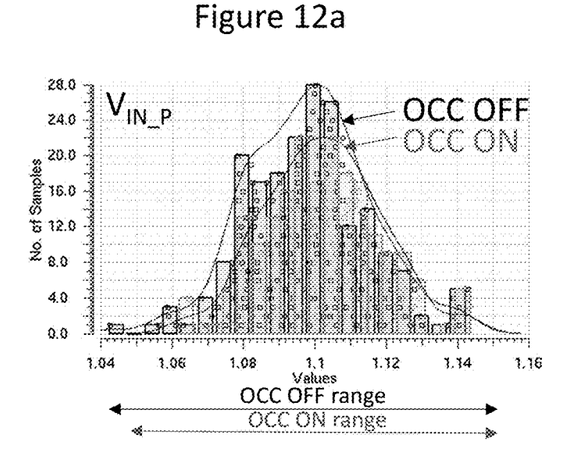
FIGS. 12a to 12d are Monte Carlo plots of input and output voltages with and without offset cancellation.
Figure 12B:
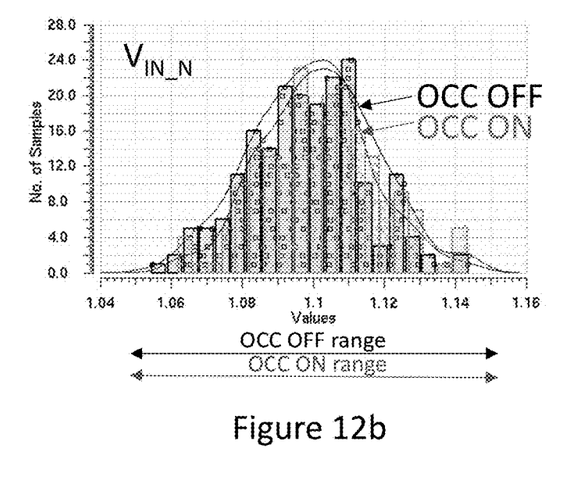

Input voltage is set by the DC cancellation circuit 21. Process variation changes the input voltage VIN_P VIN_N. The offset cancellation does not affect the input voltage, as shown in FIG. 12a, 12b, where the input voltage distribution remains relatively constant irrespective of having the OCC ON or OFF.

Figure 12C:
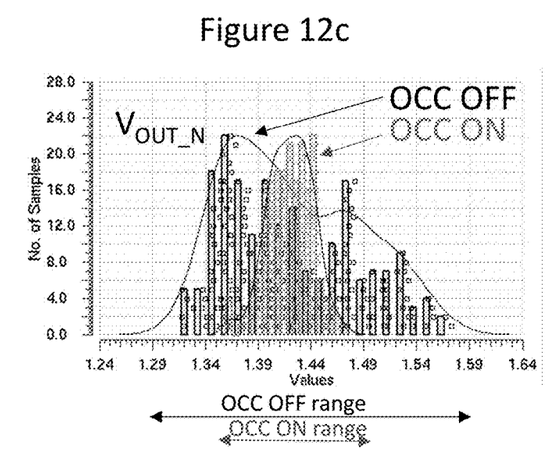
Figure 12D:
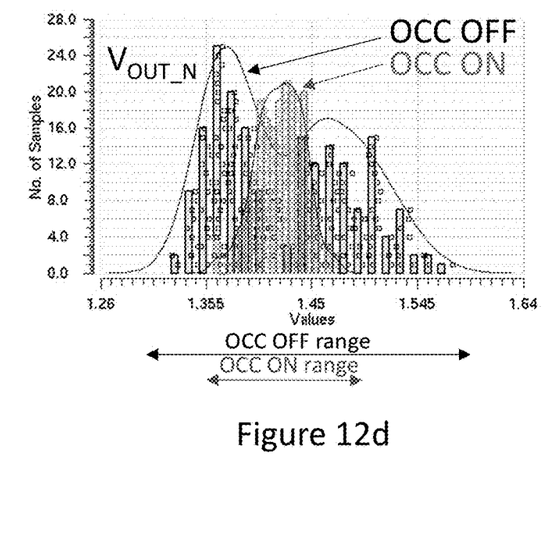

The output voltage does depend on the OCC 31, when turned on the output voltage variation reduces, FIG. 12c, 12d, and the difference between VOUT_P and VOUT_N (i.e., output offset) is even lower, as shown in FIG. 9.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An optical receiver comprising:
   at least one photodetector capable of generating a differential input current including first and second input current components in response to an optical signal;
   a trans-impedance amplifier (TIA) capable of converting the first and second input current components into first and second input voltage components;
   a DC cancellation circuit (DCCC) for cancelling a DC portion of the first and second input current components or the first and second input voltage components by comparing the first and second input current components or the first and second input voltage components to respective first and second reference voltages or currents, and sinking the DC portion of the first and second input current components based on the comparisons; and
   an offset cancellation circuit (OCC) capable of obtaining first and second voltage samples after the TIA and of cancelling offset between the first and second input voltage components by modifying at least one of the first or second reference voltages.

2. The optical receiver according to claim 1, wherein the offset cancellation circuit comprises:
   a voltage comparator for determining the offset by comparing the first and second voltage samples; and
   a voltage summer for adding or subtracting the offset to or from one of the first or second reference voltages.

3. The optical receiver according to claim 1, wherein the offset cancellation circuit comprises:
   a voltage comparator for determining the offset by comparing the first and second voltage samples; and
   a voltage summer for adding a portion of the offset to one of the first or second reference voltages and subtracting another portion of the offset from the other of the first or second reference voltages.

4. The optical receiver according to claim 1, further comprising a variable gain amplifier (VGA) capable of amplifying the first and second input voltage components to a desired output voltage forming first and second output voltage components.

5. The optical receiver according to claim 4, further comprising first and second OCC sensing points positioned between the TIA and VGA enabling the offset cancellation circuit to sample the first and second input voltage components, respectively, for the first and second sample voltages.

6. The optical receiver according to claim 1, further comprising first and second OCC sensing points positioned after the VGA enabling the offset cancellation circuit to sample the first and second output voltage components, respectively, for the first and second sample voltages.

7. The optical receiver according to claim 4, further comprising:
   a driver stage after the VGA for driving subsequent stages of the optical receiver; and
   first and second OCC sensing points positioned after the driver stage enabling the offset cancellation circuit to sample the first and second output voltage components, respectively, for the first and second sample voltages.

8. The optical receiver according to claim 1, wherein the DC cancellation circuit comprises:
   a voltage comparator for comparing a sample of each of the first and second input current components or the first and second input voltage components to the first and second reference voltages, respectively, generating first and second comparisons; and a current sink for sinking the DC portions of the first and second input current components based on the first and second comparisons.

9. The optical receiver according to claim 8, further comprising first and second DCCC sensing points positioned before the TIA enabling the DC cancellation circuit to sample the first and second input current components, respectively.

10. The optical receiver according to claim 8, further comprising first and second DCCC sensing points positioned after the TIA enabling the DC cancellation circuit to sample the first and second input voltage components, respectively.

11. The optical receiver according to claim 10, wherein the offset cancellation circuit comprises:
- a voltage comparator for determining an offset by comparing the samples of the first and second input voltage components; and
- a voltage summer for adding or subtracting the offset to or from one of the first or second reference voltages.

12. The optical receiver according to claim 8, wherein the offset cancellation circuit comprises a weighted summer capable of adding or subtracting a difference between the first and second voltage samples, and modifying the first and second reference voltages used by the current sink based on the difference.

\* \* \* \* \*